United States Patent [19]

Chang et al.

[11] Patent Number: 5,028,564
[45] Date of Patent: Jul. 2, 1991

[54] EDGE DOPING PROCESSES FOR MESA STRUCTURES IN SOS AND SOI DEVICES

[76] Inventors: Chen-Chi P. Chang, 2515 Alta Vista Dr., Newport Beach, Calif. 92660; Kuan Y. Liao, 3932 Capri, Irvine, Calif. 92714; Joseph E. Farb, 4839 Hedrick, Riverside, Calif. 92505

[21] Appl. No.: 352,583

[22] Filed: Apr. 27, 1989

[51] Int. Cl.$^5$ .......................................... H01L 21/225
[52] U.S. Cl. .................................. 437/158; 437/160; 437/162; 437/164; 148/DIG. 31; 148/DIG. 44
[58] Field of Search ................. 437/21, 158, 160, 162, 437/163, 164; 148/DIG. 31, DIG. 44, DIG. 150; 357/23.7

[56] References Cited

U.S. PATENT DOCUMENTS

| | | | |
|---|---|---|---|
| 3,890,632 | 6/1975 | Ham et al. | 357/49 |
| 4,072,974 | 2/1978 | Ipri | 357/42 |
| 4,178,191 | 12/1979 | Flatley | 357/49 |
| 4,199,860 | 4/1980 | Beelitz et al. | 437/65 |
| 4,649,626 | 3/1987 | Leong | 437/158 |

Primary Examiner—Olik Chaudhuri
Attorney, Agent, or Firm—Terje Gudmestad; W. K. Denson-Low

[57] ABSTRACT

Methods of fabricating heavily doped edges of mesa structures in silicon-on-sapphire and silicon-on-insulator semiconductor devices. The methods are self-aligning and require a minimum of masking steps to achieve. The disclosed methods reduce edge leakage and resolve N-channel threshold voltage instability problems. Mesa structures are formed that comprise N-channel and P-channel regions having a thermal oxide layer deposited thereover. A doping layer of borosilicate glass, or alternatively, an undoped oxide layer that is subsequently implanted, is deposited over the mesa structures. In the first method, the doping layer is etched by means of an anisotropic plasma etching procedure to form oxide spacers at the edges of the mesa structures. The doping layer is removed from the N-mesa structures using an N-channel mask and wet oxide etching procedure. The structure is then heated to a relatively high temperature to drive the dopant into the edges of the N-channel mesa structures. The protective layers are then removed by a wet etching procedure. The semiconductor device is fabricated to completion in a conventional manner thereafter. In the second method, a nitride layer is deposited over the mesa structures and thermal oxide layer. A thin oxide layer, which is generally deposited by means of a chemical vapor deposition procedure, is deposited over the silicon nitride layer. The formed structure is then processed to expose the N-channel mesa structures. This is accomplished using an N-well mask, the oxide layer is etched to expose the silicon nitride layer over the N-channel, and the nitride layer covering the N-channel is removed by means of hot phosphoric acid using the oxide layer as a mask. The doping layer is then deposited over the mesa structures. This doping layer is then heated to drive the dopant/implant into the edges of the N-channel mesa structures. The doping layer is then removed by wet oxide etching, the nitride layer is removed by rinsing in hot phosphoric acid and the thermal oxide layer is removed by a wet oxide etching procedure. The semiconductor device is again fabricated to completion in a conventional manner thereafter.

26 Claims, 2 Drawing Sheets

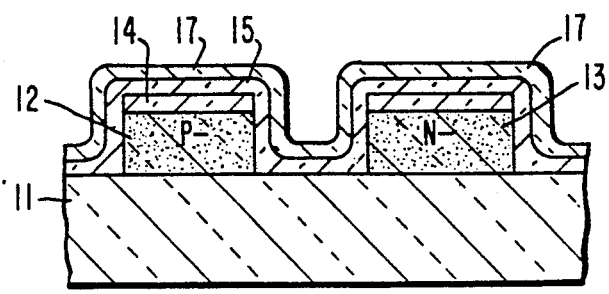
Fig.2a.
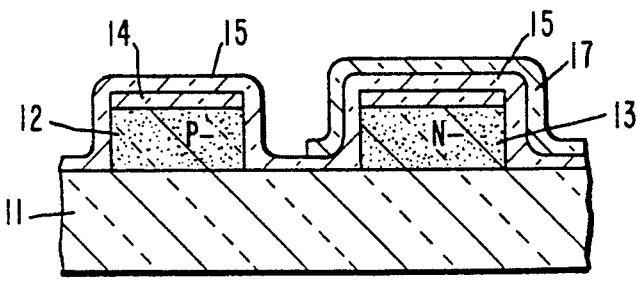
Fig.2b.
Fig.2c.
Fig.2d.
Fig.2e.
Fig.2f.

EDGE DOPING PROCESSES FOR MESA STRUCTURES IN SOS AND SOI DEVICES

BACKGROUND

The present invention relates generally to silicon-on-sapphire and silicon-on-insulator semiconductor processing, and more particularly to methods of forming doped edges on the sides of the mesas of such silicon-on-sapphire and silicon-on-insulator semiconductors.

Conventional bulk CMOS semiconductor fabrication processes employ guard bands, or guard rings, to minimize leakage. However, conventional N-channel silicon-on-sapphire and silicon-on-insulator semiconductors have mesa structures in which no such guard bands are employed. Typically, no edge doping is performed, and the substrate is employed as a guard band in an attempt to prevent leakage. In radiation hard silicon-on-sapphire and silicon-on-insulator semiconductor devices it is necessary to heavily dope the mesa edges to eliminate edge leakage and threshold instability. In the past it has been difficult to dope these edges to achieve radiation hard device performance, for example.

SUMMARY OF THE INVENTION

It is therefore a feature of the present invention to provide a variety of methods by which to accomplish the edge doping of mesa structures in N-channel silicon on-sapphire-semiconductor devices.

In order to accomplish the edge doping, the present invention provides for two methods that accomplish this task. In general, the method comprises the steps of forming mesa structures on the surface of a substrate that comprise N-channel and P-channel silicon islands having thermal oxide on the top surface thereof. The formed mesa structures are then processed to deposit doping material adjacent the edges of the mesa structures which are to be doped. The mesa structures and doping material are then heated to drive the dopant contained in the doping material into the edges of the mesa structures. In a first method, the processing step comprises the steps of depositing a doping layer over the mesa structures, and forming doped oxide spacers adjacent the edges of the mesa structures which are to be doped. In a first method, the processing step comprises the following steps. A nitride layer is deposited over the mesa structures. An oxide layer is then deposited over the nitride layer. The nitride and oxide layers are masked and etched to expose the mesa structures that are to be doped. Then, the doping layer is deposited over the exposed mesa structures, and it is heated to drive the dopant into the edges of the mesa structures.

More particularly, the first method comprises the following steps. First, mesa structures are formed using a mask layer comprising oxide and silicon nitride. The mesa structures comprise N-channel and P-channel regions. Then, a layer of borosilicate glass or boron doped oxide is deposited over the mesa structures. The layer of borosilicate glass or boron doped oxide is then etched by means of an anisotropic plasma etching procedure to form oxide spacers at the edges of the N-channel and P-channel regions. The layer of borosilicate glass or boron doped oxide over the P-channel region is removed using an N-channel mask and wet oxide etching procedure. Then the structure is then heated to a relatively high temperature, on the order of 600-1000 degrees Celsius, to drive the dopant into the edges of the N-channel. The silicon oxide and silicon nitride are then removed by a wet etching procedure. The semiconductor device is fabricated to completion in a conventional manner thereafter.

More particularly, the second method of achieving the edge doping in accordance with the principles of the present invention comprises the following steps. N-channel and P-channel silicon islands are defined using a thermal oxide and photoresist as an etching mask. A silicon nitride layer is deposited over the mesa structures. Then a thin chemically vapor deposited oxide layer is deposited over the silicon nitride layer. The N-channel is then masked using a photoresist, and the oxide layer is etched to expose the silicon nitride layer over the N-channel. The silicon nitride layer covering the N-channel is removed by means of hot phosphoric acid using the chemically vapor deposited oxide as a mask layer. A boron doped chemically vapor deposited oxide layer is then deposited over the mesa structures. Alternatively, an undoped chemically vapor deposited oxide layer may be deposited and subsequently boron implanted. This doped/implanted layer is then heated to a relatively high temperature, on the order of 600-1000 degrees Celsius, to drive the dopant/implant into the edges of the N-channel mesa structures. The boron doped chemically vapor deposited oxide, or implanted oxide, is then removed by wet oxide etching, the silicon nitride is removed by rinsing in hot phosphoric acid and the thermal oxide is removed by a wet oxide etching procedure. The semiconductor device is fabricated to completion in a conventional manner thereafter.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 2 illustrates a self-aligned method of forming dopes edges of silicon islands in silicon-on-sapphire semiconductor devices in accordance with the principles of the present invention.

DETAILED DESCRIPTION

Figure 1A:
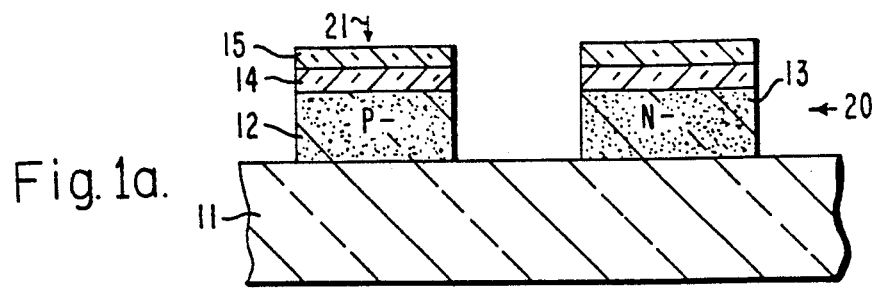
FIG. 1 illustrates a first method of forming dopes edges of silicon islands in silicon-on-sapphire semiconductor devices employing oxide spacers in accordance with the principles of the present invention.

Referring to FIG. 1, a first self aligning method of forming doped edges of N-channel silicon islands in a silicon-on-sapphire semiconductor device in accordance with the principles of the present invention is shown. This method employs doped or implanted oxide spacers to obtain the desired edge doping concentration. With reference to FIG. 1a, the silicon-on-sapphire semiconductor device comprises an insulating substrate 11, which may comprise an aluminum oxide, or the like, or a multi-level structure comprising silicon on silicon, on which is formed P⁻ and N⁻ silicon mesas 12, 13, that comprise mesa structures 20 of the device. The silicon mesas 12, 13 may be formed in a conventional manner using a mask layer 21 comprising a thermal oxide layer 14, which may comprise silicon dioxide, for example, and a nitride layer 15, which may comprise silicon nitride, for example, on top of the thermal oxide layer 14. The mask layer 21 is etched using a dry plasma or wet solution as is well-known in the art, for example, to form the mesa structures 20 shown in FIG. 1a. The mesa structures 20 typically have dimensions on the order of 2 microns by 2 microns with a thickness of about 0.5 microns, for example. The thermal oxide layer 14 typically has a thickness in the range of from 100 Angstroms, while the nitride layer typically has a similar thickness, and is typically about 500 Angstroms thick, for example.

Figure 1B:
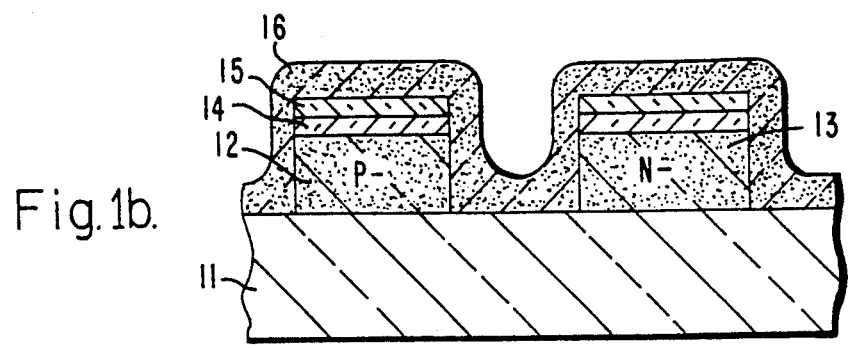
Figure 1C:
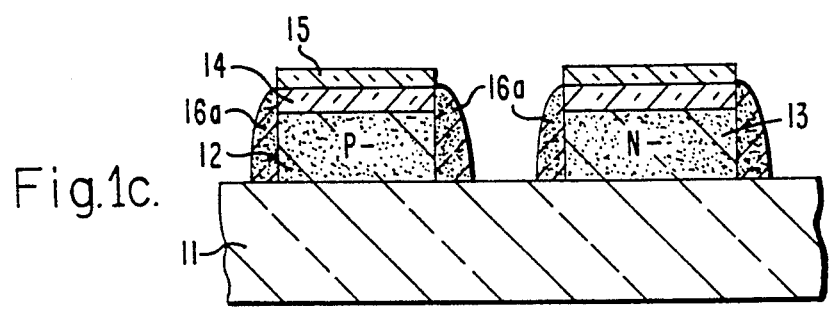

With reference to FIG. 1b, a borosilicate glass layer 16, or alternatively or undoped chemical vapor deposited oxide layer 16, which may comprise silicon dioxide, and which is subsequently implanted with boron, is deposited over the entire substrate 11 and mesa structures 20. The borosilicate glass layer 16 is deposited to a thickness of about 3000 Angstroms. With reference to FIG. 1c, the borosilicate glass layer 16 is then etched my means of a conventional anisotropic plasma etching procedure, for example, to form boron doped/implanted oxide spacers 16a. The thermal oxide layer 14 and nitride layer 15 are employed to prevent anisotropic etching procedure from exposing the silicon in the mesas 12, 13. In addition, it is employed to increase the height of the oxide spacer 16a. Without protection, an undoped portion of the silicon mesa 12 would be doped, which would result in undesired leakage.

Figure 1D:
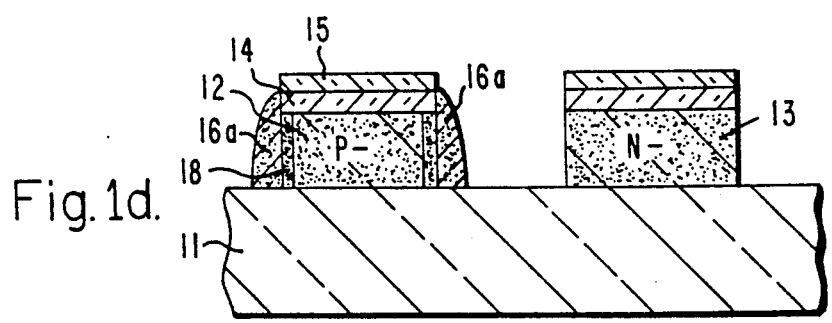
Figure 1E:
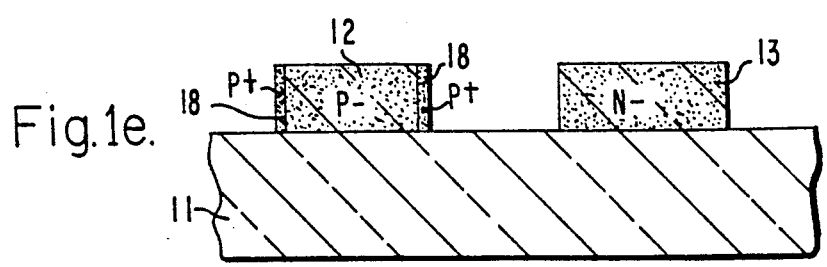

With reference to FIG. 1d, the boron doped/implanted oxide spacers 16 surrounding the N-channel mesa 13 is removed by depositing a P well mask comprising a photoresist layer, and then etching the surface using a conventional wet oxide etching procedure. The boron doped oxide spacers 16a surrounding the P− mesa 12 is then heated to a relatively high temperature, in the range of from 600-1000 degrees Celsius, and typically about 800 degrees Celsius, to drive the boron into the edge of the P− mesa to form highly doped P+ edges 18 thereon. With reference to FIG. 1e, the silicon nitride layer 15 and thermal oxide layer 14 are then removed using a wet etching procedure. This results in the structure shown in FIG. 1e, wherein the P− mesa has P+ doped edges 18. The balance of the desired silicon-on-sapphire semiconductor device is then fabricated in a conventional manner until the device is completed.

Referring to FIG. 2, a second self-aligning method of forming dopes edges of N-channel silicon islands in a silicon-on-sapphire semiconductor device in accordance with the principles of the present invention is shown. With reference to FIG. 2a, this second method includes the steps of fabricating the substrate 11 having the P− and N− mesas 12, 13 formed on the surface thereof. The mesas 12, 13 are formed using the thermal oxide layer 14 as the mask layer. The dimensions and thicknesses of the layers are substantially the same as given above with reference to FIG. 1.

With reference to FIG. 2b, a silicon nitride layer 15 is then deposited over the entire substrate 11 which also covers the mesa structures 20. Then a relatively thin chemical vapor deposited oxide layer 17 is deposited over the silicon nitride layer 15. This chemical vapor deposited oxide layer 17 is deposited at a temperature of around 400 degrees Celsius, and to a thickness of about 3000 Angstroms.

With reference to FIG. 2c, the N− mesa 13 is then masked and the oxide layer 17 is etched to expose the silicon nitride layer 15 above the P− mesa 12. With reference to FIG. 2d, the silicon nitride layer 15 is then removed to expose the underlying P− mesa 12 and thermal oxide layer 14 covering its top surface.

With reference to FIG. 2e, the borosilicate glass layer 16, or alternatively, the undoped chemical vapor deposited oxide layer 16, which is subsequently boron implanted, is deposited on exposed surface of the substrate 11 and mesa structures 20. The boron doped oxide layer 16, or boron implanted chemical vapor deposited oxide layer 16, is then heated to a relatively high temperature, in the range of from 600-1000 degrees Celsius, and typically about 800 degrees Celsius, to drive the boron into the edge of the P− mesa to form highly doped P+ edges 18 thereon. The thermal oxide layer 14 is employed as a diffusion barrier to the borosilicate glass layer 16 during the heating process.

With reference to FIG. 2f, the boron doped chemical vapor deposited oxide layer 16, or boron implanted chemical vapor deposited oxide layer 16, is then removed using a wet etching procedure. The silicon nitride layer 15 is removed using a hot phosphoric acid rinse. The thermal oxide layer 14 is removed by means of a wet oxide etching procedure. The balance of the desired silicon-on-sapphire semiconductor device 10 is then fabricated in a conventional manner until the device 10 is completed.

Thus, new and improved methods of fabricating heavily doped edges of mesa structures in silicon-on-sapphire semiconductor devices have been described. The methods are self-aligning and require a minimum of masking steps to achieve. The disclosed methods reduce edge leakage and resolve N-channel threshold voltage instability problems.

It is to be understood that the above-described embodiments are merely illustrative of some of the many specific embodiments which represent applications of the principles of the present invention. Clearly, numerous and other arrangements can be readily devised by those skilled in the art without departing from the scope of the invention.

What is claimed is:

1. A method of doping edges of silicon mesa structures, said method comprising the steps of:
   forming mesa structures on the surface of a substrate, which mesa structures comprise N-channel and P-channel silicon islands having thermal oxide on the top surface thereof;
   processing the thermal oxide to deposit doping material adjacent the edges of the mesa structures which are to be doped; and
   heating the mesa structures and doping material to drive the dopant contained therein into the edges of the mesa structures.

2. The method of claim 1 wherein the processing step comprises the steps of:
   depositing a doping layer over the mesa structures; and
   forming doped oxide spacers adjacent the edges of the mesa structures which are to be doped.

3. The method of claim 1 wherein the step of forming mesa structures comprises the step of:
   forming mesa structures on the surface of a substrate, which mesa structures comprise N-channel and P-channel silicon islands having thermal oxide on the top surface thereof and a nitride layer on the surface of the thermal oxide.

4. The method of claim 3 wherein the processing step comprises the steps of:
   depositing a doping layer over the mesa structures; and forming doped oxide spacers adjacent the edges of the mesa structures which are to be doped.

5. The method of claim 1 wherein the step of forming doped oxide spacers adjacent the edges of the mesa structures that are to be doped comprises the steps of:
anisotropically etching the doping layer to form doped oxide spacers adjacent the edges of all mesa structures;
depositing a mask layer over the mesa structures that are to have their edges doped; and
removing the oxide spacers from the unmasked mesa structures.

6. The method of claim 5 which further comprises the step of:
removing the thermal oxide layer from the mesa structures.

7. The method of claim 2 wherein the step of depositing a doping layer over the mesa structures comprises the step of:
chemically vapor depositing a doped oxide layer over the exposed surfaces.

8. The method of claim 2 wherein the step of depositing a doping layer over the mesa structures comprises the steps of:
chemically vapor depositing an undoped oxide layer over the mesa structures; and
implanting dopant into the chemically vapor deposited oxide layer.

9. A method of doping edges of silicon mesa structures, said method comprising the steps of:
forming mesa structures on the surface of a substrate, which mesa structures comprise N-channel and P-channel silicon islands having thermal oxide on the top surface thereof;
depositing a doping layer over the mesa structures;
forming doped oxide spacers adjacent the edges of the mesa structures which are to be doped; and
heating the doped oxide spacers to drive dopant contained in the doped oxide spacers into the edges of the mesa structures.

10. A method for doping edges of silicon mesas to increase the edge doping concentration thereof in order to prevent edge leakage and threshold voltage instability, said method comprising the steps of:
forming mesa structures on the surface of a substrate, which mesa structures comprise N-channel and P-channel silicon islands having thermal oxide on the top surface thereof;
depositing a nitride layer on the top surface of the thermal oxide layer;
depositing a doped oxide layer over the substrate and mesa structures;
anisotropically plasma etching the doped oxide layer to leave doped oxide spacers adjacent the edges of the mesa structures;
depositing a mask layer over the mesa structures which are to be doped;
removing the oxide spacers from the edges of the mesa structures which are not to be doped;
heating the mesa structures and doping material to drive the dopant contained therein into the edges of the mesa structures;
removing the thermal oxide and nitride layers.

11. The method of claim 10 wherein the step of depositing a doped oxide layer comprises the step of:
chemically vapor depositing an undoped oxide layer over the mesa structures; and
implanting dopant into the chemically vapor deposited oxide layer.

12. The method of claim 10 wherein the step of depositing a doped oxide layer comprises the step of:
chemically vapor depositing a boron doped layer of oxide over the substrate and mesa structures.

13. The method of claim 10 wherein the step of depositing a doped oxide layer comprises the step of:
depositing a borosilicate glass layer over the substrate and mesa structures.

14. The method of claim 1 wherein the processing step comprises the steps of:
depositing a nitride layer over the mesa structures;
depositing an oxide layer over the nitride layer;
masking and etching the nitride and oxide layers to expose the mesa structures that are to be doped; and
depositing a doping layer over the exposed mesa structures.

15. The method of claim 14 which further comprises the steps of:
removing the nitride and thermal oxide layers from the mesa structures.

16. The method of claim 14 wherein the masking and etching step comprises the steps of:
masking the nitride and oxide layers to expose the mesa structures that are to be doped using a photoresist material; and
anisotropically etching the nitride and oxide layers to expose the mesa structures.

17. A method of doping edges of silicon mesa structures, said method comprising steps of:
forming mesa structures comprising N-channel and P-channel silicon islands having a thermal oxide layer on the top surface thereof and on the surface of a substrate;
depositing a nitride layer over the mesa structures;
depositing an oxide layer over the nitride layer;
masking and etching the nitride and oxide layers to expose the mesa structures that are to be doped;
depositing a doping layer over the exposed mesa structures;
heating the doping layer to drive the dopant into the edges of the exposed mesa structures;
removing the layers covering the mesa structures to provide edge doped mesa structures.

18. The method of claim 17 wherein the step of depositing a doping layer over the mesa structures comprises the steps of:
chemically vapor depositing an undoped oxide layer over the mesa structures; and
implanting dopant into the chemically vapor deposited oxide layer.

19. The method of claim 17 wherein the step of depositing a doping layer comprises the step of:
chemically vapor depositing a boron doped layer of oxide over the mesa structures.

20. The method of claim 17 wherein the step of depositing an oxide layer comprises the step of:
depositing a borosilicate glass layer over the substrate and mesa structures.

21. A method for doping edges of silicon mesas to increase the edge doping concentration thereof in order to prevent edge leakage and threshold voltage instability, said method comprising the steps of:
forming mesa structures comprising N-channel and P-channel silicon islands having a thermal oxide layer on the top surface thereof on the surface of a substrate;

depositing a nitride layer on the top surface of the thermal oxide mask layer;

depositing a doped oxide layer over the substrate and mesa structures;

anisotropically plasma etching the doped oxide layer to leave doped oxide spacers on the edges of the mesa structures;

depositing a mask layer over the mesa structures which are to be doped;

removing the oxide spacers from the edges of the mesa structures which are not to be doped;

heating the doping layer to drive the dopant into the edges of the exposed mesa structures;

removing the thermal oxide and nitride layers.

22. A method for doping edges of silicon mesas, said method comprising the steps of:

forming mesa structures comprising N-channel and P-channel silicon islands having a thermal oxide layer on the top surface thereof on the surface of a substrate;

depositing a nitride layer over the exposed substrate and mesa structures;

depositing a layer of oxide over the nitride layer;

masking and etching the nitride and oxide layers to expose the mesa structures that are to be doped;

depositing a doping layer over the exposed mesa structures;

heating the doping layer to drive the dopant into the edges of the exposed mesa structures;

removing the layers covering the mesa structures to provide edge doped mesa structures.

23. A method for doping edges of silicon mesas to increase the edge doping concentration thereof in order to prevent edge leakage and threshold voltage instability, said method comprising the steps of:

forming mesa structures comprising N-channel and P-channel silicon islands having a thermal oxide layer on the top surface thereof on the surface of a substrate;

depositing a nitride layer over the mesa structures;

chemically vapor depositing an oxide layer over the nitride layer;

depositing a photoresist mask over the oxide layer in the areas of the mesa structures that are to be doped;

etching the oxide layer to expose the underlying nitride layer;

removing the nitride layer over the mesa structures that are to be doped by using hot phosphoric acid and employing the chemically vapor deposited oxide layer as a mask layer over the mesa structures that are not to be doped;

depositing a doping layer over the exposed mesa structures;

heating the doping layer to drive the dopant into the edges of the exposed mesa structures; and removing the layers covering the mesa structures to provide edge doped mesa structures.

24. The method of claim 23 wherein the step of depositing a doping layer over the mesa structures comprises the step of:

chemically vapor depositing a doped oxide layer over the exposed surfaces.

25. The method of claim 23 wherein the step of depositing a doping layer over the mesa structures comprises the steps of:

chemically vapor depositing an undoped oxide layer over the mesa structures; and implanting dopant into the chemically vapor deposited oxide layer.

26. The method of claim 23 wherein the removing step comprises the steps of:

removing the doped chemically vapor deposited oxide layer using a wet oxide etch;

then removing the nitride layer using phosphoric acid; and then removing the thermal oxide by a wet oxide etch.

* * * * *